US012665168B2

(12) United States Patent
Lee et al.

(10) Patent No.: US 12,665,168 B2
(45) Date of Patent: Jun. 23, 2026

(54) WAFER PROCESSING APPARATUS USING PLASMA PHASE SHIFT

(71) Applicant: ASM IP Holding B.V., Almere (NL)

(72) Inventors: Jeongsu Lee, Pyeongtaek-si (KR); Dongok Shin, Suwon (KR); Songwhe Herr, Seongnam-si (KR); DaeYoun Kim, Seo-gu (KR)

(73) Assignee: ASM IP Holding B.V., Almere (NL)

( * ) Notice: Subject to any disclaimer, the term of this patent is extended or adjusted under 35 U.S.C. 154(b) by 55 days.

(21) Appl. No.: 18/674,057

(22) Filed: May 24, 2024

(65) Prior Publication Data

US 2024/0404790 A1 Dec. 5, 2024

Related U.S. Application Data

(60) Provisional application No. 63/469,671, filed on May 30, 2023.

(51) Int. Cl.
*H01J 37/32* (2006.01)
(52) U.S. Cl.
CPC .............................. *H01J 37/32174* (2013.01)
(58) Field of Classification Search
None
See application file for complete search history.

(56) References Cited

U.S. PATENT DOCUMENTS

| | | | | |
|---|---|---|---|---|
| 3,609,094 A * | 9/1971 | Shaffer | ................ | C09K 11/771 |
| | | | | 252/301.4 P |
| 5,057,185 A * | 10/1991 | Thomas, III | ...... | H01J 37/32082 |
| | | | | 204/298.34 |
| 5,824,606 A | 10/1998 | Dible | | |
| 6,020,686 A * | 2/2000 | Ye | ..................... | H01J 37/32091 |
| | | | | 315/111.21 |
| 6,155,199 A * | 12/2000 | Chen | ................. | H01J 37/32174 |
| | | | | 118/723 R |
| 8,426,763 B2 * | 4/2013 | Qin | ..................... | H01L 21/2636 |
| | | | | 118/725 |
| 9,161,428 B2 | 10/2015 | Collins | | |
| 9,614,524 B1 * | 4/2017 | Kawasaki | ......... | H01J 37/32165 |
| 10,790,119 B2 * | 9/2020 | Ma | ..................... | H01L 21/02057 |
| 10,889,891 B2 * | 1/2021 | L'Heureux | ....... | H01J 37/32871 |
| 10,950,421 B2 * | 3/2021 | Valcore, Jr. | ....... | H01J 37/32183 |
| 10,998,170 B2 * | 5/2021 | Yoshida | ............ | H01J 37/32082 |

(Continued)

FOREIGN PATENT DOCUMENTS

KR 101736847 B1 5/2017

*Primary Examiner* — Srinivas Sathiraju
(74) *Attorney, Agent, or Firm* — Snell & Wilmer L.L.P.

(57) ABSTRACT

A wafer processing system using plasma would be presented. The system may comprise a plurality of reaction chambers disposed on a platform, each of them being configured to process wafers; a plasma generator coupled to the plurality of reaction chambers individually and configured to generate plasma with a certain frequency and a certain phase, and further configured to provide the generated plasma to the plurality of reaction chambers; and a control circuit connected to the plasma generator and configured to adjust the phase of the plasma generated by the plasma generator; wherein, the control circuit is further configured to shift the phase of the generated plasma provided to the plurality of reaction chambers independently.

12 Claims, 3 Drawing Sheets

(56)                References Cited

U.S. PATENT DOCUMENTS

| | | | |
|---|---|---|---|
| 11,042,140 B2 * | 6/2021 | Coumou | H01J 37/32174 |
| 11,164,725 B2 * | 11/2021 | Zhang | C23C 16/06 |
| 12,080,520 B2 * | 9/2024 | Oliveti | H01J 37/32183 |
| 12,206,372 B2 * | 1/2025 | Gruner | H03F 1/0211 |
| 2004/0086434 A1 * | 5/2004 | Gadgil | H01L 21/30655 |
| | | | 422/186.21 |
| 2004/0200499 A1 * | 10/2004 | Harvey | C23C 16/4405 |
| | | | 134/1.1 |
| 2005/0178748 A1 * | 8/2005 | Buchberger | H01J 37/32183 |
| | | | 219/121.48 |
| 2006/0196426 A1 * | 9/2006 | Gluck | H01J 37/32082 |
| | | | 118/723 R |
| 2010/0224321 A1 * | 9/2010 | Grimbergen | H01J 37/321 |
| | | | 156/345.24 |
| 2010/0230053 A1 * | 9/2010 | Nishio | H01J 37/32678 |
| | | | 156/345.49 |
| 2010/0273277 A1 * | 10/2010 | Qin | H01L 21/67248 |
| | | | 438/798 |
| 2011/0192820 A1 * | 8/2011 | Yeom | H01L 21/32137 |
| | | | 156/345.26 |
| 2011/0212624 A1 * | 9/2011 | Hudson | H01J 37/32596 |
| | | | 156/345.29 |
| 2014/0209090 A1 * | 7/2014 | Snyder | F24S 80/60 |
| | | | 126/643 |
| 2017/0011886 A1 * | 1/2017 | Nozawa | H01J 37/32422 |

| | | | |
|---|---|---|---|
| 2018/0330921 A1 * | 11/2018 | Radomski | H01J 37/321 |
| 2018/0358208 A1 * | 12/2018 | Ma | H01J 37/3244 |
| 2019/0068158 A1 * | 2/2019 | Coumou | H03H 7/48 |
| 2019/0385822 A1 * | 12/2019 | Marakhtanov | H01J 37/32183 |
| 2019/0391547 A1 * | 12/2019 | Coumou | H01J 37/32165 |
| 2020/0126765 A1 * | 4/2020 | Ulrich | H01J 37/32183 |
| 2020/0168439 A1 * | 5/2020 | Bhutta | H01J 37/32183 |
| 2020/0266650 A1 * | 8/2020 | Cho | H02J 50/12 |
| 2021/0005431 A1 * | 1/2021 | Ma | H01L 21/31138 |
| 2021/0074529 A1 * | 3/2021 | Labanc | H03F 3/189 |
| 2021/0090962 A1 * | 3/2021 | Kapoor | G01R 15/18 |
| 2021/0098233 A1 * | 4/2021 | Kapoor | C23C 16/52 |
| 2021/0113723 A1 * | 4/2021 | Malinowski | A61L 2/10 |
| 2021/0217588 A1 * | 7/2021 | Savas | H01L 21/67253 |
| 2021/0261148 A1 * | 8/2021 | Li | G06V 20/584 |
| 2021/0264167 A1 * | 8/2021 | Chen | G06V 10/82 |
| 2021/0311448 A1 * | 10/2021 | Coumou | G05B 19/042 |
| 2022/0216838 A1 * | 7/2022 | Gruner | H01J 37/32165 |
| 2023/0104096 A1 * | 4/2023 | Oliveti | H01J 37/32935 |
| | | | 315/111.21 |
| 2023/0298871 A1 * | 9/2023 | Labanc | H03F 3/189 |
| | | | 156/345.48 |
| 2023/0411116 A1 * | 12/2023 | Chen | H01J 37/32018 |
| 2024/0170258 A1 * | 5/2024 | Tamamushi | H05H 1/46 |
| 2024/0203711 A1 * | 6/2024 | Kapoor | H01J 37/32935 |
| 2024/0404790 A1 * | 12/2024 | Lee | H01J 37/32165 |
| 2025/0166971 A1 * | 5/2025 | Herr | H01J 37/32174 |

* cited by examiner (a)

(b)

WAFER PROCESSING APPARATUS USING PLASMA PHASE SHIFT

CROSS-REFERENCE TO RELATED APPLICATIONS

This application claims priority to U.S. Provisional Patent Application Ser. No. 63/469,671 filed May 30, 2023 titled WAFER PROCESSING APPARATUS USING PLASMA PHASE SHIFT, the disclosure of which is hereby incorporated by reference in its entirety.

FIELD OF INVENTION

The present disclosure relates to a wafer processing apparatus, particularly to an apparatus which uses plasma for processing wafers with multiple reaction chambers in a platform.

BACKGROUND OF THE DISCLOSURE

Some conventional wafer processing apparatuses share the same platform and bottom chamber among the reaction chambers. For example, one exemplary platform may comprise 4 reaction chambers.

The plasma fed into the reaction chambers has a certain frequency and a certain phase. And due to this, each reaction chamber would affect other reaction chambers when in operation. More specifically, low plasma window, unstable plasma, low repeatability, no matching between reaction chambers (RCs), and center plasma may occur due to the interactions among the plasma waves of the reaction chambers.

FIGS. 2(a) and (b) illustrate some aspects of the problems of the conventional apparatus with 4 chambers in one platform.

FIG. 2(a) illustrates the settings of a reaction chamber in sectional view.

A normal plasma 201 may be formed between an upper electrode 205 of a reaction chamber 200 and a wafer support 206. However, just below the wafer support 206, a bottom plasma 202 may be formed and below it, a shaft plasma 203 may also be formed.

Moreover, a center plasma 204 may also be created in the center of the platform (apparatus) 215 in FIG. 2(b).

This center plasma 204, 215 forms due to the constructive interference from the reaction chambers around the center 215, RC1 211, RC2 212, RC3 213, RC4 214 and this constructive interference can be seen in a graph 260's wave "A." The constructive interference is formed at a middle point 215 of the reaction chambers RC1 through RC4 211, 212, 213, 214.

An original wave "B" is depicted in FIG. 2 (b) and each of the RCs are fed in the same wave "B" (220, 230, 240, 250). The resulting wave, i.e., center plasma "A" may have much bigger amplitude than that of the original wave "B".

This center plasma is induced from the waves fed into surrounding RCs and it would affect the plasma quality and eventually the quality of wafers after processing.

Therefore, the present disclosure presents an apparatus for minimizing the center plasma.

SUMMARY OF THE DISCLOSURE

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

In accordance with one embodiment there may be provided, a wafer processing system using plasma, the system comprising: a first reaction chamber, a second reaction chamber, a third reaction chamber, and a fourth reaction chamber disposed on a platform, each of them being configured to process wafers; a plasma generator configured to generate plasma with a certain frequency and a certain phase, and further configured to provide the generated plasma to the first reaction chamber, the second reaction chamber, the third reaction chamber and the fourth reaction chamber; and a control circuit connected to the plasma generator and configured to adjust the phase of the plasma generated by the plasma generator; wherein, the control circuit is further configured to shift the phase of the generated plasma provided to the first reaction chamber, the second reaction chamber, the third reaction chamber, and the fourth reaction chamber, independently.

In at least one aspect, the phase of the plasma provided to the second reaction chamber is 90 degrees ahead of that provided to the first reaction chamber, and the phase of the plasma provided to the third reaction chamber is 90 degrees ahead of that provided to the second reaction chamber, and the phase of the plasma provided to the fourth reaction chamber is 90 degrees ahead of that provided to the third reaction chamber.

In at least one aspect, the phase of the plasma provided to the second reaction chamber is 90 degrees behind of that provided to the first reaction chamber, and the phase of the plasma provided to the third reaction chamber is 90 degrees behind of that provided to the second reaction chamber, and the phase of the plasma provided to the fourth reaction chamber is 90 degrees behind of that provided to the third reaction chamber.

In accordance with another embodiment there may be provided, a wafer processing system using plasma, the system comprising: a plurality of reaction chambers disposed on a platform, each of them being configured to process wafers; a plasma generator coupled to the plurality of reaction chambers respectively and configured to generate plasma with a certain frequency and a certain phase, and further configured to provide the generated plasma to the plurality of reaction chambers; and a control circuit connected to the plasma generator and configured to adjust the phase of the plasma generated by the plasma generator; wherein, the control circuit is further configured to shift the phase of the generated plasma provided to the plurality of reaction chambers independently.

In at least one aspect, the control circuit is further configured to shift the generated plasma by (360/n) degrees for each of the plurality of reaction chambers, where n is the number of the reaction chambers.

In at least one aspect, the control circuit is further configured to change the phase of the generated plasma provided to the plurality of reaction chambers in real-time.

BRIEF DESCRIPTION OF THE DRAWING FIGURES

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

FIG. 2(*b*) illustrates how an original wave "B" is fed into the 4 reaction chambers to make resulting center plasma's wave "A" in a prior art system.

FIG. 3(*b*) illustrates the resulting plasma power and the advantage of the present disclosure's apparatus according to an embodiment of the present disclosure.

DETAILED DESCRIPTION OF EXEMPLARY EMBODIMENTS

Figure 1:
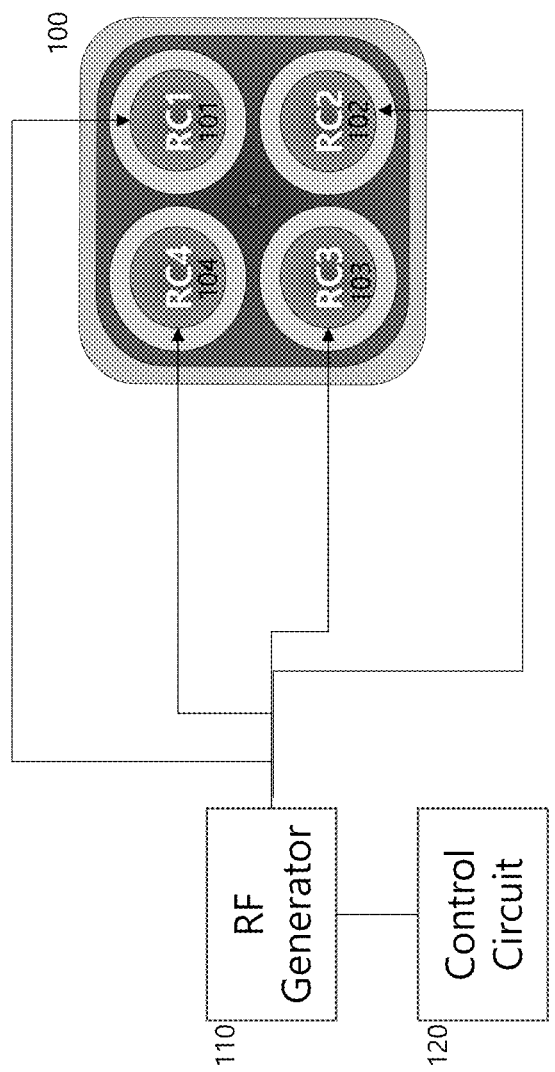
FIG. 1 illustrates the overview of an apparatus according to an embodiment of the present disclosure.
Figure 2:
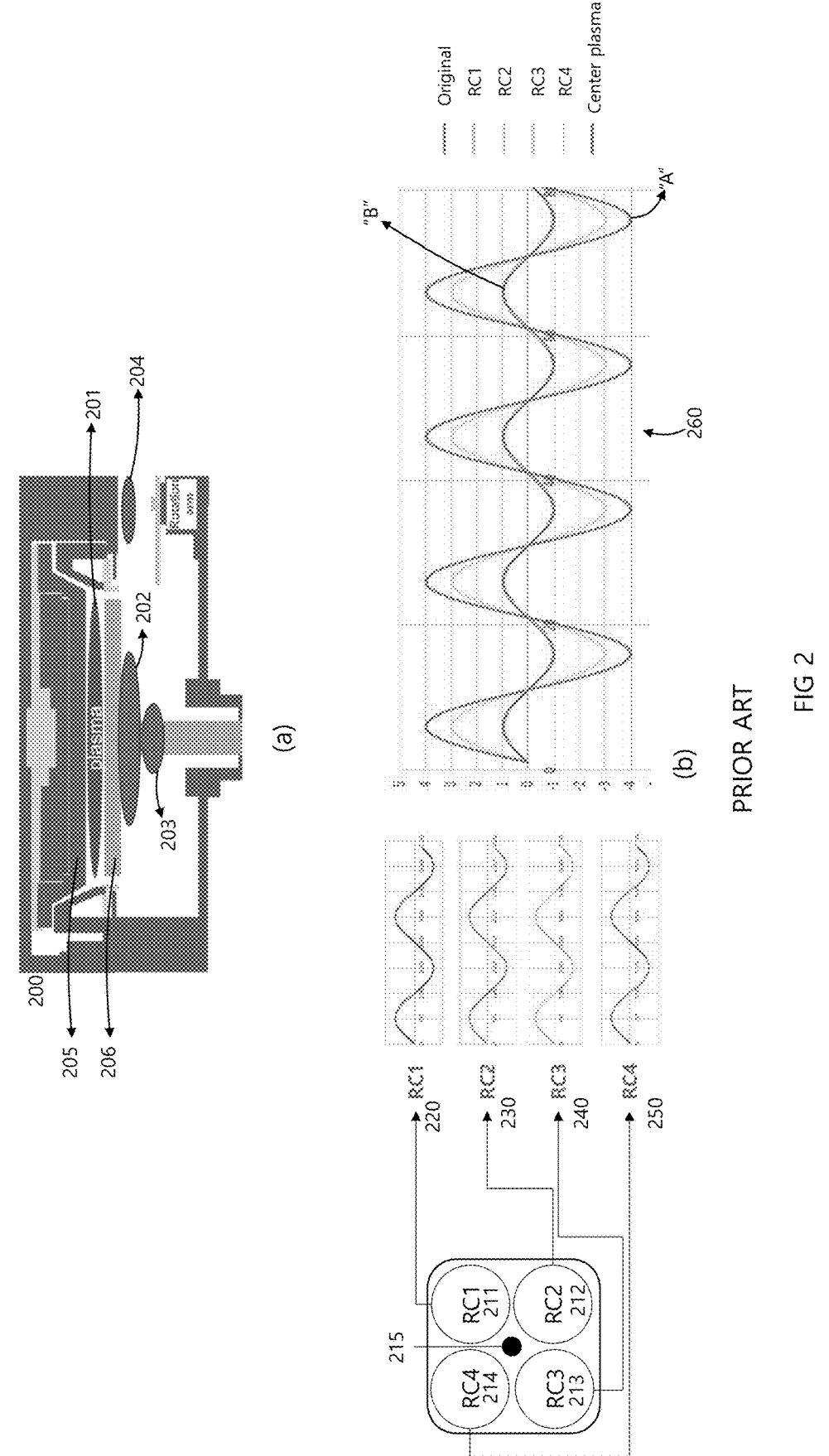
FIG. 2(*a*) illustrates a sectional view of a prior art reaction chamber and the positions of the plasma occurrences in the reaction chamber.

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below.

As used herein, the term "substrate" may refer to any underlying material or materials, including any underlying material or materials that may be modified, or upon which, a device, a circuit, or a film may be formed. The "substrate" may be continuous or non-continuous; rigid or flexible; solid or porous; and combinations thereof. The substrate may be in any form, such as a powder, a plate, or a workpiece. Substrates in the form of a plate may include wafers in various shapes and sizes. Substrates may be made from semiconductor materials, including, for example, silicon, silicon germanium, silicon oxide, gallium arsenide, gallium nitride and silicon carbide.

For example, a substrate in the form of a powder may have applications for pharmaceutical manufacturing. A porous substrate may comprise polymers. Examples of workpieces may include medical devices (for example, stents and syringes), jewelry, tooling devices, components for battery manufacturing (for example, anodes, cathodes, or separators) or components of photovoltaic cells, etc.

A continuous substrate may extend beyond the bounds of a process chamber where a deposition process occurs. In some processes, the continuous substrate may move through the process chamber such that the process continues until the end of the substrate is reached. A continuous substrate may be supplied from a continuous substrate feeding system to allow for manufacture and output of the continuous substrate in any appropriate form.

Non-limiting examples of a continuous substrate may include a sheet, a non-woven film, a roll, a foil, a web, a flexible material, a bundle of continuous filaments or fibers (for example, ceramic fibers or polymer fibers). Continuous substrates may also comprise carriers or sheets upon which non-continuous substrates are mounted.

The illustrations presented herein are not meant to be actual views of any particular material, structure, or device, but are merely idealized representations that are used to describe embodiments of the disclosure.

The particular implementations shown and described are illustrative of the invention and its best mode and are not intended to otherwise limit the scope of the aspects and implementations in any way. Indeed, for the sake of brevity, conventional manufacturing, connection, preparation, and other functional aspects of the system may not be described in detail. Furthermore, the connecting lines shown in the various figures are intended to represent exemplary functional relationships and/or physical couplings between the various elements. Many alternative or additional functional relationship or physical connections may be present in the practical system, and/or may be absent in some embodiments.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. Thus, the various acts illustrated may be performed in the sequence illustrated, in other sequences, or omitted in some cases.

The subject matter of the present disclosure includes all novel and nonobvious combinations and subcombinations of the various processes, systems, and configurations, and other features, functions, acts, and/or properties disclosed herein, as well as any and all equivalents thereof.

FIG. 1 illustrates the overview of the present disclosure's apparatus.

The platform 100 may contain 4 reaction chambers (RC) RC1 101, RC2 102, RC3 103, and RC4 104. The four reaction chambers 101, 102, 103, 104 may process wafers with plasma.

The plasma used in the RCs may be generated in a plasma generator 110. The generated plasma may be transmitted to each of the RCs via coupled lines.

A control circuit 120 may be connected to the plasma generator 110 and may also control the phase of the plasma provided to each of the reaction chambers, independently of each other.

Figure 3:
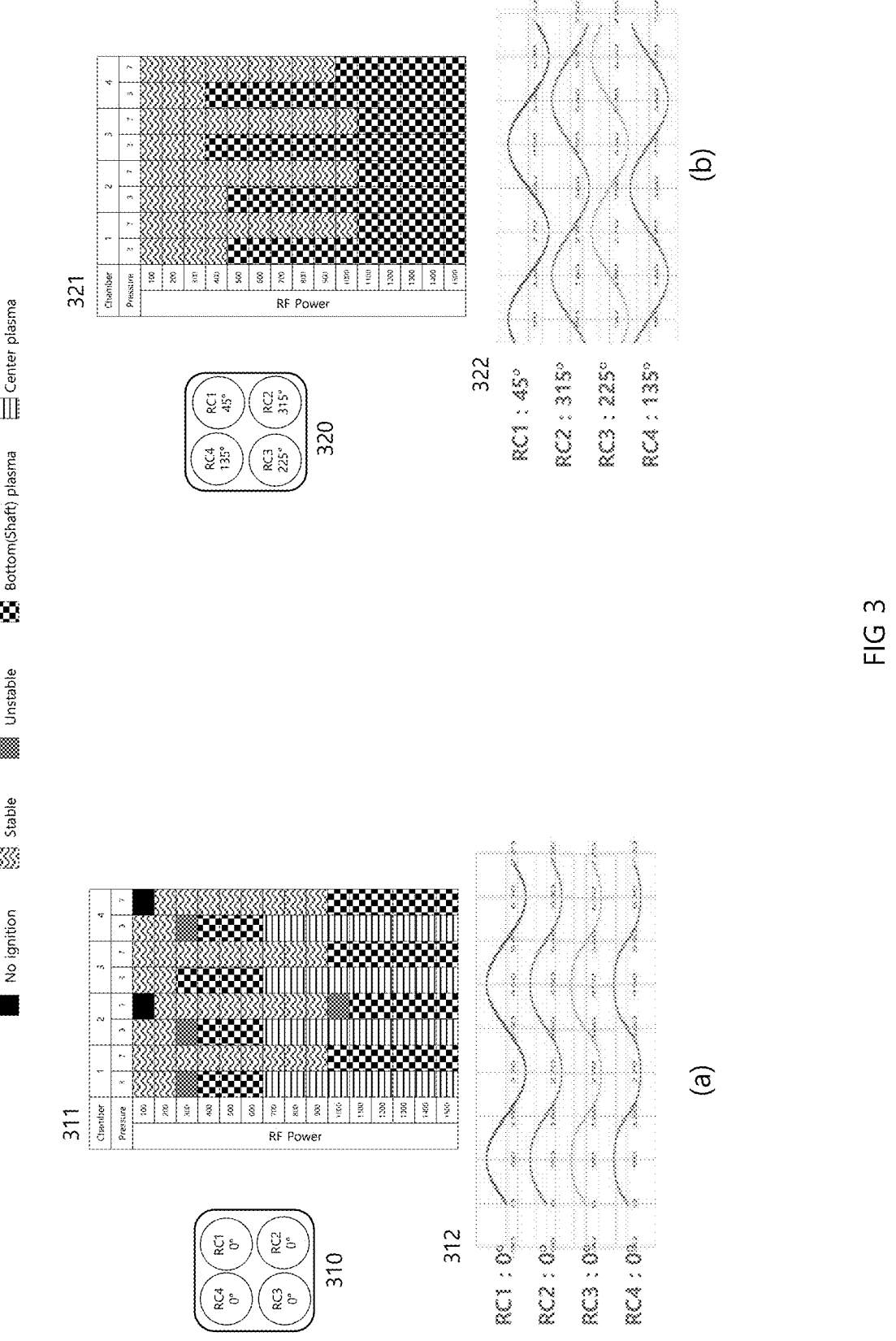
FIG. 3(*a*) illustrates how the plasma power are reflected in the 4 reaction chambers in conventional setup.

For example, as shown in FIG. 3(*b*), RC1 is fed with a plasma with 45° phase and in counterclockwise direction, RC4 is fed with a plasma with 135°, 90° shift from that of RC1, and RC3 is fed with a plasma with 225°, 90° shift from that of RC4, and RC2 is fed with a plasma with 315°, 90° shift from that of RC3.

With this phase shift among the RCs, a destructive interference may be created so that there would be no "center plasma" generated from constructive interference.

Another example, though not illustrated, would be a situation when RC1 is fed with a plasma with 0° phase and in clockwise direction. RC2 is fed with a plasma with 90° (90° shift from that of RC1). RC3 is fed with a plasma with 180° (90° shift from that of RC2). RC4 is fed with a plasma with 270°, a 90° shift from that of RC3.

This exemplary phase shift among the RCs would result in no "center plasma" from constructive interference because the phase difference would cause a destructive interference in the place of the "center plasma".

This phase shift would be applied to an apparatus with more than 4 RCs.

For example, in case of 6 RCs instead of 4, the shifted phase may be 60°, not 90°. Generally, with n RCs disposed in a platform, a phase that need to be shifted to cancel out the "center plasma" effect with a destructive interference may be $(360/n)°$.

This phase shift would be calculated in the control circuit 120 automatically with the number of RCs or would be hard-wired and each phase-shifted plasma would be transmitted to each of the RCs just like the 4 RC example.

As shown in FIG. 3(*b*) compared with FIG. 3(*a*), an embodiment of the present disclosure may show better plasma performance.

As shown in 320 of FIG. 3(*b*), the plasma is shifted by 90 degrees and the starting phase would be 45 degrees in RC1 and in clockwise the RCs may be fed with a plasma increasing phase by 90 degrees from the previous RC.

As shown in FIG. 3(*a*)'s table 311, the plasma performance in each of the RCs is diminished without phase shifting. Even "no ignition" and "unstable" plasma conditions exist and in many power ranges, the "center plasma" may exist resulting in instabilities within the plasma.

On the other hand, as shown in FIG. 3(*b*)'s table 321, even though about half of the status in the power ranges are "bottom/shaft plasma", the rest are "stable".

Moreover, due to destructive interference among the RCs, "center plasma" as well as "no ignition" and "unstable" does not exist in the table 321.

As shown, just by shifting the phase of the plasma provided into each RCs individually, the plasma efficiency may improve greatly as well as wafer quality after processing.

The control circuit 120 may also change the plasma phases provided to each of the reaction chambers when the plasma is being provided. When the plasma's 90 degrees shift of FIG. 3(*b*) may not result in enough efficiency as expected, the plasma shift may be is changed in real-time during operation of the reaction chambers such as 60 degrees of starting phase in RC1 and increasing 90 degrees phases from the previous RC in clockwise RC order.

The above-described arrangement of apparatus is merely illustrative of applications of the principles of this invention and many other embodiments and modifications may be made without departing from the spirit and scope of the invention as defined in the claims. The scope of the invention should, therefore, be determined not with reference to the above description, but instead should be determined with reference to the appended claims along with their full scope of equivalents.

The invention claimed is:

1. A wafer processing system using plasma, the system comprising:

a first reaction chamber, a second reaction chamber, a third reaction chamber, and a fourth reaction chamber disposed on a platform, each of them being configured to process wafers;

a plasma generator coupled to the first/second/third/fourth reaction chambers individually and configured to generate a plasma with a certain frequency and a certain phase, and further configured to provide the generated plasma to the first reaction chamber, the second reaction chamber, the third reaction chamber and the fourth reaction chamber; and a control circuit connected to the plasma generator and configured to adjust the phase of the plasma generated by the plasma generator;

wherein the control circuit is further configured to shift the phase of the generated plasma provided to the first reaction chamber, the second reaction chamber, the third reaction chamber, and the fourth reaction chamber, independently, wherein the control circuit is configured to shift the phase of the generated plasma provided to the second reaction chamber 90 degrees ahead of the phase of the generated plasma provided to the first reaction chamber, wherein the control circuit is configured to shift the phase of the generated plasma provided to the third reaction chamber 90 degrees ahead of the phase of the generated plasma provided to the second reaction chamber, wherein the control circuit is configured to shift the phase of the generated plasma provided to the fourth reaction chamber 90 degrees ahead of the phase of the generated plasma provided to the third reaction chamber.

2. The wafer processing system according to the claim 1, wherein each of the first reaction chamber, the second reaction chamber, the third reaction chamber, and the fourth reaction chamber are disposed regularly around a center of the platform.

3. The wafer processing system according to the claim 2, wherein the control circuit is further configured to shift the phase of the generated plasma provided to the first reaction chamber, the second reaction chamber, the third reaction chamber, and the fourth reaction chamber, independently, such that no plasma is generated in the center of the platform.

4. The wafer processing system according to the claim 2, wherein the control circuit is further configured to shift the phase of the generated plasma provided to the first reaction chamber, the second reaction chamber, the third reaction chamber, and the fourth reaction chamber, independently, such that destructive interference suppresses plasma formation in the center of the platform.

5. The wafer processing system according to the claim 1, wherein each of the first reaction chamber, the second reaction chamber, the third reaction chamber, and the fourth reaction chamber are disposed equidistantly around a center of the platform.

6. The wafer processing system according to the claim 1, wherein the first reaction chamber is disposed adjacent to the second reaction chamber and the fourth reaction chamber, and wherein the third reaction chamber is disposed adjacent to the second reaction chamber and the fourth reaction chamber.

7. A wafer processing system using plasma, the system comprising: a plurality of reaction chambers disposed on a platform, each of them being configured to process wafers;

a plasma generator coupled to the plurality of reaction chambers individually and configured to generate plasma with a certain frequency and a certain phase, and further configured to provide the generated plasma to the plurality of reaction chambers; and a control circuit connected to the plasma generator and configured to adjust the phase of the plasma generated by the plasma generator;

wherein the control circuit is further configured to shift the phase of the generated plasma provided to the plurality of reaction chambers independently, wherein the control circuit is further configured to shift the phase of generated plasma provided to a nth reaction chamber (360/a total number of reaction chambers) degrees ahead of the phase of the generated plasma provided to a (n−1)th reaction when n is 2 or more.

8. The wafer processing system according to claim 7, wherein each of the plurality of reaction chambers are disposed regularly around a center of the platform.

9. The wafer processing system according to the claim 8, wherein the control circuit is further configured to shift the phase of the generated plasma provided to the plurality of reaction chambers, independently, such that no plasma is generated in the center of the platform.

10. The wafer processing system according to the claim 8, wherein the control circuit is further configured to shift the phase of the generated plasma provided to the plurality of reaction chambers, independently, such that such that destructive interference suppresses plasma formation in the center of the platform.

11. The wafer processing system according to claim 7, wherein the control circuit is further configured to change the phase of the generated plasma provided to the plurality of reaction chambers in real-time.

12. The wafer processing system according to the claim 7, wherein each of the plurality of reaction chambers are disposed equidistantly around a center of the platform.

* * * * *